(12) United States Patent
Matsumoto et al.

(10) Patent No.: US 7,994,793 B2
(45) Date of Patent: *Aug. 9, 2011

(54) JIG FOR DETECTING POSITION

(75) Inventors: Toshiyuki Matsumoto, Hyogo (JP);
Tomohide Minami, Hyogo (JP); Koji Mahara, Kumamoto (JP); Yuichi Douki, Kumamoto (JP)

(73) Assignee: Tokyo Electron Limited, Tokyo (JP)

( * ) Notice: Subject to any disclaimer, the term of this patent is extended or adjusted under 35 U.S.C. 154(b) by 336 days.

This patent is subject to a terminal disclaimer.

(21) Appl. No.: 12/254,998

(22) Filed: Oct. 21, 2008

(65) Prior Publication Data

US 2009/0115422 A1 May 7, 2009

(30) Foreign Application Priority Data

Nov. 5, 2007 (JP) ................................. 2007-286934

(51) Int. Cl.
*G01R 29/12* (2006.01)
(52) U.S. Cl. .................... 324/457; 324/658; 324/757.01; 324/690; 355/75; 414/222.01; 414/809
(58) Field of Classification Search ................... 324/457, 324/757
See application file for complete search history.

(56) References Cited

U.S. PATENT DOCUMENTS

| 5,801,764 | A | * | 9/1998 | Koizumi et al. | ............... | 348/125 |
| 6,244,121 | B1 | | 6/2001 | Hunter | | |
| 6,350,957 | B1 | * | 2/2002 | Shingai et al. | ................ | 174/254 |
| 2008/0290881 | A1 | * | 11/2008 | Mallory et al. | ............... | 324/690 |
| 2009/0033908 | A1 | * | 2/2009 | Matsumoto et al. | ............ | 355/75 |
| 2009/0051370 | A1 | * | 2/2009 | Doki et al. | ..................... | 324/658 |

FOREIGN PATENT DOCUMENTS

| JP | 10-181875 | A | | 7/1998 |
| JP | 2001-091205 | A | | 4/2001 |
| JP | 2001-91205 | A | | 4/2001 |
| JP | 2001091205 | A | * | 4/2001 |
| JP | 2001-267400 | A | | 9/2001 |
| JP | 2007-80960 | A | | 3/2007 |
| JP | 2007080960 | A | * | 3/2007 |

OTHER PUBLICATIONS

Korean Office action for 10-2008-0098552 dated Jul. 22, 2010.
Japanese Office action for 2007-286934 dated Sep. 15, 2009.

* cited by examiner

*Primary Examiner* — Timothy J Dole
*Assistant Examiner* — Benjamin M Baldridge
(74) *Attorney, Agent, or Firm* — Pearne & Gordon LLP

(57) ABSTRACT

A transfer point of a transfer arm is detected accurately and stably by using a position detecting wafer having an electrostatic capacitance sensor. A position detecting wafer S is formed in a wafer shape transferable by a transfer arm 20 and includes an electrostatic capacitance sensor 50 for detecting a relative position with respect to a reference object by detecting an electrostatic capacitance in relation with the reference object for a position detection. The electrostatic capacitance sensor 50 includes a detection electrode 52 for forming the electrostatic capacitance in relation with the reference object, and the detection electrode 52 is installed on a rear surface of a main body of the wafer shape. Installed on the main body is a guard electrode 100 covering the detecting electrode 52 when viewed from a front surface thereof, for blocking an electric field oriented toward the detection electrode 52 from the front surface.

11 Claims, 17 Drawing Sheets

JIG FOR DETECTING POSITION

FIELD OF THE INVENTION

The present disclosure relates to a position detecting jig for detecting a transfer point of a transfer arm for holding and transferring a substrate.

BACKGROUND OF THE INVENTION

For example, in a manufacturing process of semiconductor devices, a photolithography process is performed by a coating and developing system including a plurality of apparatuses such as a resist coating apparatus, a developing apparatus, a heat treating apparatus and the like. The coating and developing system has a transfer mechanism for transferring a wafer to each of the apparatuses.

The transfer mechanism has a transfer arm for holding the wafer thereon, and, for example, the transfer arm moves three-dimensionally in forward-backward, left-right, and up-down directions to transfer the wafer to each apparatus.

However, in case that the wafer is not transferred to a preset position in each apparatus, the delivery of the wafer may not be performed properly or processing of the wafer may not be carried out properly because of a deviation of a processing position of the wafer, for example. For this reason, when starting the coating and developing system, for example, it is checked whether or not the transfer arm has transferred the wafer to the preset position. In the event that the wafer is not transferred to the right position, the transfer point of the transfer arm is adjusted.

Patent Document 1 discloses an example method for adjusting the transfer position, wherein the method involves the steps of holding a trajectory-detecting wafer having a CCD camera by the transfer arm; transferring the trajectory-detecting wafer by the transfer arm; and detecting a transfer stop position of the transfer arm by the CCD camera.

[Patent Document 1] Japanese Patent Laid-open Publication No. 2003-243479

However, an optical apparatus such as the CCD camera needs to have a sufficient thickness in a vertical direction due to the necessity of an adjusting mechanism of a focus, a focal length or the like. For this reason, as for an apparatus having a reduced opening size due to miniaturization of the wafers being transferred, it is impossible to load the trajectory-detecting wafer into the apparatus, and to adjust the position thereof properly, either.

Therefore, the present inventors have proposed mounting a thin electrostatic capacitance sensor on a position detecting wafer instead of the CCD camera. With this position detecting wafer, it is possible to detect an electrostatic capacitance between the position detecting wafer and a reference object and to detect the transfer point of the transfer arm by specifying a relative positional relationship between the reference object and the position detecting wafer based on the detected electrostatic capacitance value. However, when the electrostatic capacitance sensor is used on the position detecting wafer, there is a likelihood that the electrostatic capacitance may not be detected accurately and stably by being affected by, for example, an electric field if a generation source of the electric field is located nearby. In such case, an accurate detection of the transfer point of the transfer arm becomes impossible to achieve.

BRIEF SUMMARY OF THE INVENTION

In view of the foregoing, the object of the present disclosure is to detect a transfer point of a transfer arm more accurately and stably by using a jig such as a position detecting wafer having an electrostatic capacitance sensor.

In accordance with an aspect of the present invention, there is provided a position detecting jig for detecting a transfer point of a transfer arm which holds and transfers a substrate, the jig including: a substrate body transferable by the transfer arm; and an electrostatic capacitance sensor for detecting a relative position with respect to a reference object by detecting an electrostatic capacitance in relation with the reference object for a position detection, wherein the electrostatic capacitance sensor includes a detection electrode for forming the electrostatic capacitance in relation with the reference object, the detection electrode is installed on a rear surface of a main body of the substrate body, and installed on the main body is a guard electrode covering the detecting electrode when viewed from a front surface thereof, for blocking an electric field oriented toward the detection electrode from the front surface.

In accordance with the aspect of the present invention, since the detection electrode of the electrostatic capacitance sensor is installed on the rear surface of the main body of the position detecting jig, it is possible to detect the electrostatic capacitance in relation with the reference object on the rear surface of the position detecting jig. Furthermore, since the guard electrode is installed on the front surface of the detection electrode of the main body of the position detecting jig, it is possible to block an electric field oriented toward the detection electrode from the upper part of the position detecting jig. As a result, the transfer point of the transfer arm can be detected more accurately and stably by using the position detecting jig having the electrostatic capacitance sensor.

The electrostatic capacitance sensor may include a control circuit connected with the detection electrode, for controlling a detection of the electrostatic capacitance by the detection electrode, and the control circuit may be installed on the front surface of the main body to be located opposite to the detection electrode with the guard electrode interposed therebetween.

A rear surface wiring for connecting the control circuit with the detection electrode may be installed on the rear surface of the main body, and a front surface and a rear surface of the rear surface wiring may be covered by a rear surface wiring guard electrode. Further, when the rear surface wiring is installed to have plural rear surface wirings, both lateral sides of each rear surface wiring may be covered by individual rear surface wiring guard electrodes.

It is possible that a front surface wiring connected with the control circuit is formed on the front surface of the main body, and the rear surface wiring and the front surface wiring are connected with each other by a connection wiring extended in a thickness direction from the rear surface of the main body toward the front surface thereof, and a front surface and a rear surface of the connection wiring are covered by a connection wiring guard electrode.

A length of the connection wiring guard electrode from the connection wiring in an in-surface direction of the main body may be set to be at least three times as long as a length of an unguarded portion of the connection wiring against the electric field, ranging from the connection wiring guard electrode to a lateral guard electrode of the connection wiring.

It is possible that an amplifying circuit for amplifying a signal of the electrostatic capacitance detected by the detection electrode is installed on the front surface of the connection wiring, and the connection wiring guard electrode of the front surface thereof is formed on a surface of the amplifying circuit.

A wireless circuit communicating between an external controller for adjusting the transfer point of the transfer arm and the control circuit may be installed on the front surface of the main body.

A lateral guard electrode may be installed at a lateral portion of the detection electrode on the rear surface of the main body to surround the detection electrode.

It is possible that the detection electrode includes a plurality of electrode portions, and the respective electrode portions are surrounded by individual lateral guard electrodes.

The detection electrode may include a central electrode portion of a circular shape and a multiplicity of peripheral electrode portions of an arc shape, arranged to be concentric with the central electrode portion.

In accordance with the aspect of the present invention, since the position alignment of the transfer arm can be performed properly by detecting the transfer point of the transfer arm accurately and stably, the processing of the substrate by using the transfer arm can be conducted properly.

BRIEF DESCRIPTION OF THE DRAWINGS

The disclosure may best be understood by reference to the following description taken in conjunction with the following figures.

DETAILED DESCRIPTION OF THE INVENTION

Figure 1:
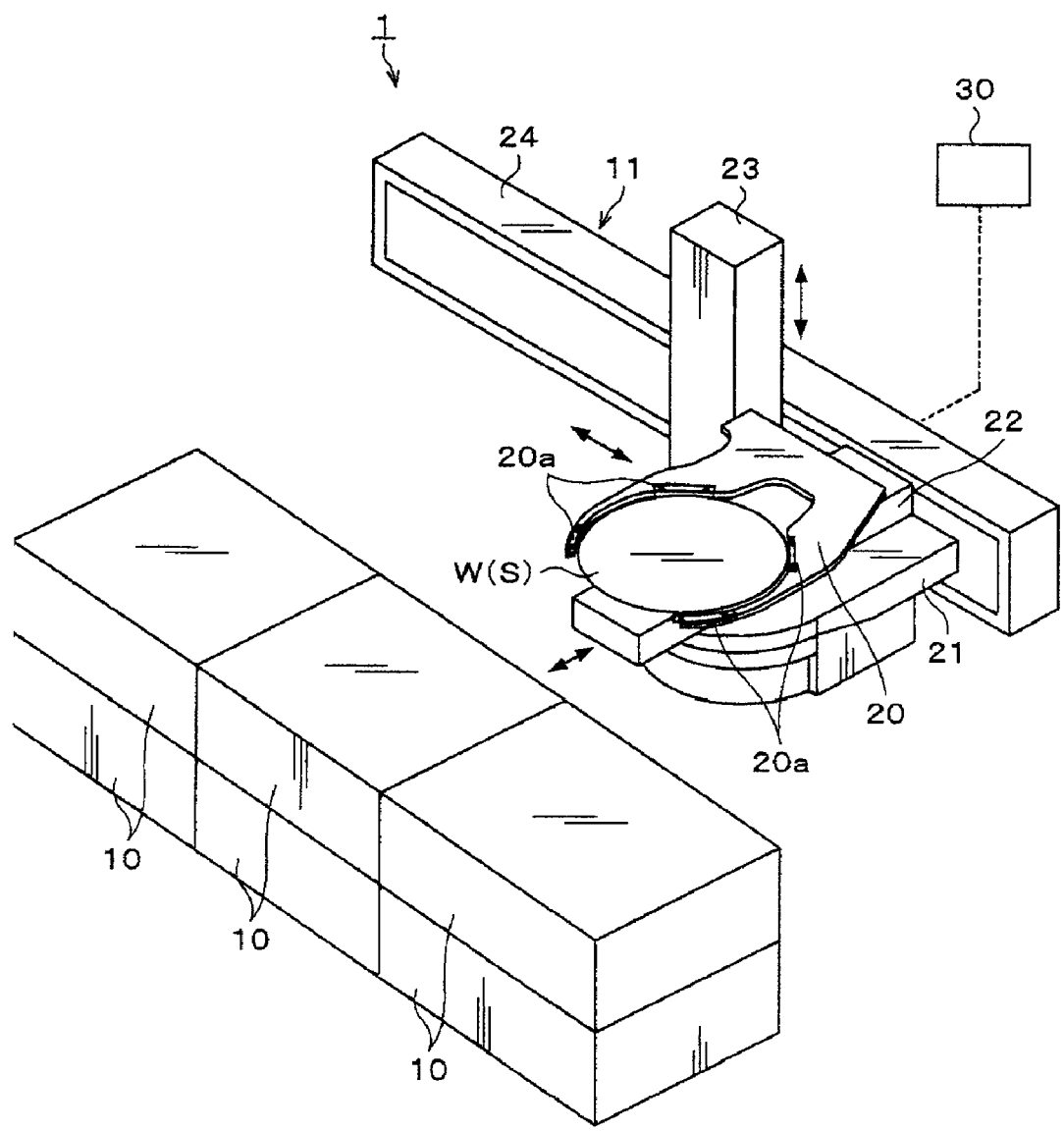
FIG. 1 is a schematic view of a substrate processing system.

Hereinafter, embodiments of the present invention will be described in detail with reference to the accompanying drawings. FIG. 1 provides a schematic configuration view of a substrate processing system 1 to which a position detecting wafer is applied as a position detecting jig in accordance with the embodiment of the present invention.

The substrate processing system 1 performs, for example, a lithography process on a wafer W, and includes a plurality of processing apparatuses 10 for processing the wafer W and a transfer mechanism 11 for transferring the wafer W to the processing apparatuses 10.

For example, the transfer mechanism 11 has a transfer arm 20. The transfer arm 20 has a front end substantially having, for example, a C shape. A plurality of supporting portions 20a is installed at inner portions of the C-shaped part of the transfer arm 20, and the wafer W can be sustained on these supporting portions 20a. The transfer arm 20 can move back and forth along a rail 22 installed on, e.g., a base 21. For example, the base 21 is attached to a rail 23 extending in a vertical direction, and the rail 23 is attached to a rail 24 extending in left and right directions. With this structure, the transfer arm 20 can move three-dimensionally in forward and backward, left and right, and up and down directions. Therefore, while supporting the wafer W by the transfer arm 20, the transfer mechanism 11 advances the transfer arm 20 into each processing apparatus 10 and transfers the wafer W to a preset position within the processing apparatus 10.

Furthermore, the transfer position of the wafer W by the transfer arm 20 is controlled by a controller 30 which controls the movement of the transfer arm 20.

Figure 2A:
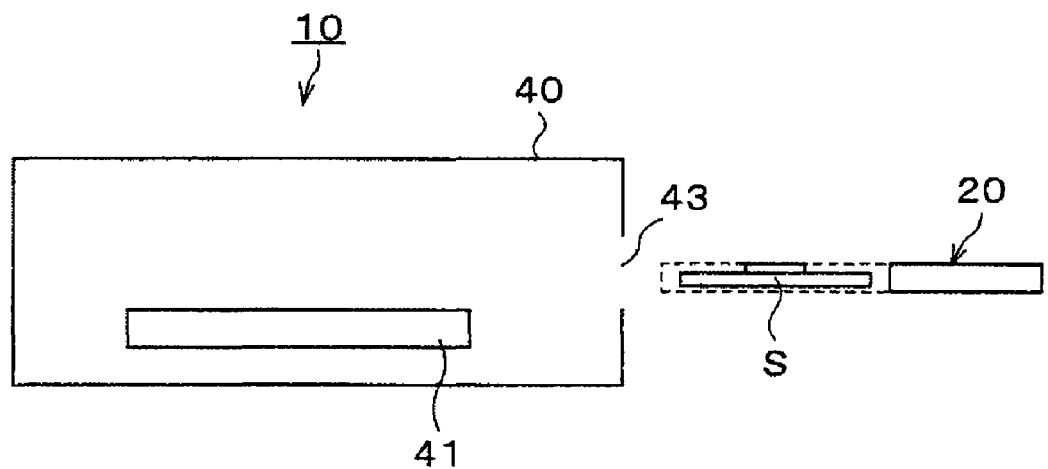
FIGS. 2A and 2B are a side view and a plan view to illustrate a schematic configuration of a processing apparatus, respectively.
Figure 2B:
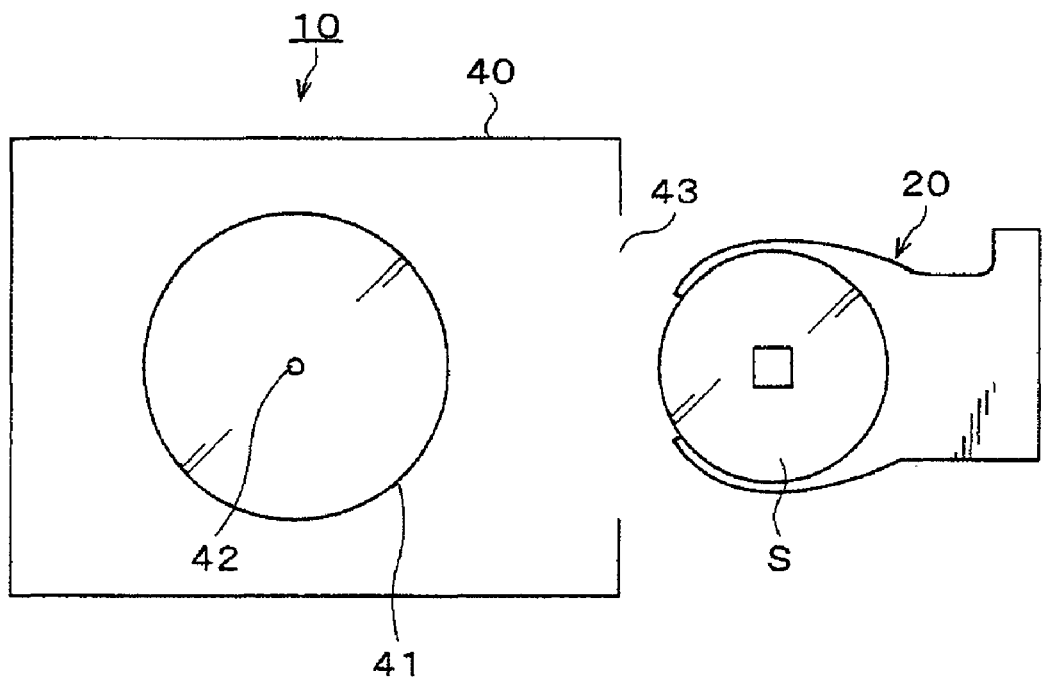

The processing apparatus 10 includes, for example, a mounting table 41 for mounting the wafer W thereon in a processing chamber 40 as illustrated in FIG. 2A. For example, as illustrated in FIG. 2B, a central hole 42 is provided on a center portion of the top surface of the mounting table 41 to be used as a reference object for position alignment. In this embodiment, an example of a proper transfer position of the wafer W is the center portion of the mounting table 41, i.e., a position where the center of the wafer W is aligned with the central hole 42 when viewed from the top. Further, a transfer port 43 through which the wafer W is loaded and unloaded by the transfer arm 20 is provided in a sidewall of the processing chamber 40.

Figure 3:
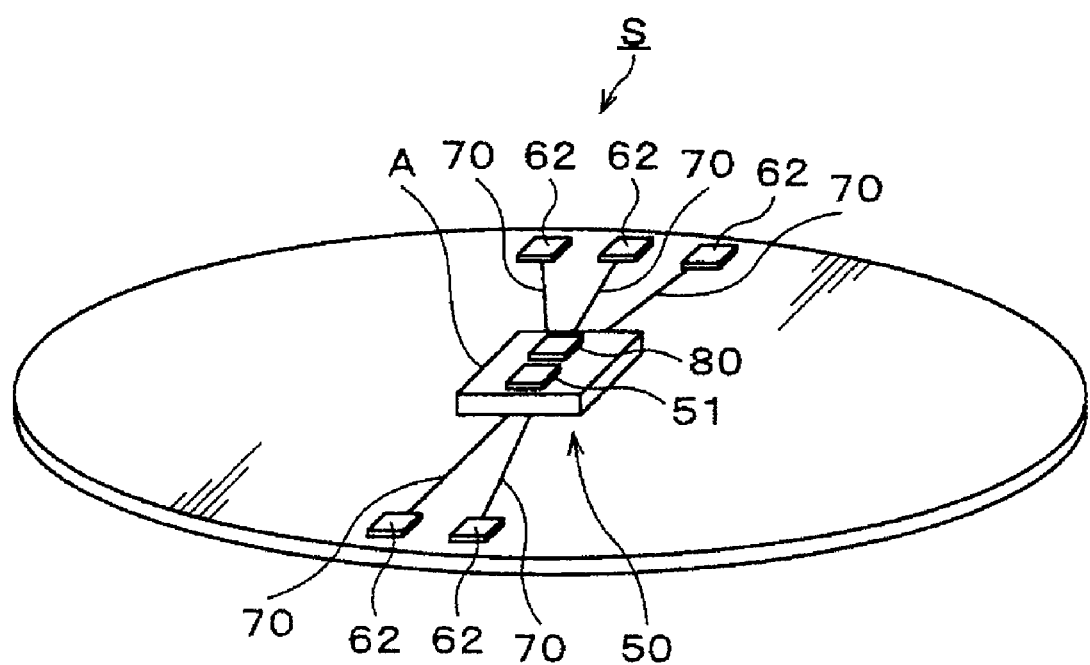
FIG. 3 is a perspective view of a position detecting wafer.

Now, the structure of a position detecting wafer S will be explained. FIG. 3 is a perspective view of the position detecting wafer S. The position detecting wafer S may be formed in the same shape and size as the product wafer W, for example, and can be transferred by the transfer arm 20. The position detecting wafer S is made of, for example, ceramic, silicon or resin in which a wiring pattern or a hole can be easily formed.

Figure 4A:
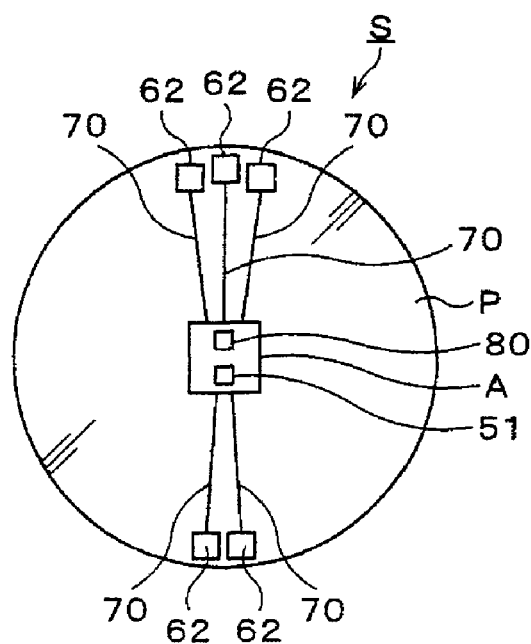
FIGS. 4A and 4B are explanatory diagrams showing a front surface and a rear surface of the position detecting wafer, respectively.

The position detecting wafer S is provided with an electrostatic capacitance sensor 50 for detecting a relative position with respect to the reference object by detecting an electrostatic capacitance between the reference object and the sensor 50. The electrostatic capacitance sensor 50 has a control circuit 51 on the front surface of a main body P of the wafer S, as illustrated in FIG. 4A, and has a detection electrode 52 on the rear surface of the main body P of the wafer S, as illustrated in FIG. 4B.

Figure 4B:
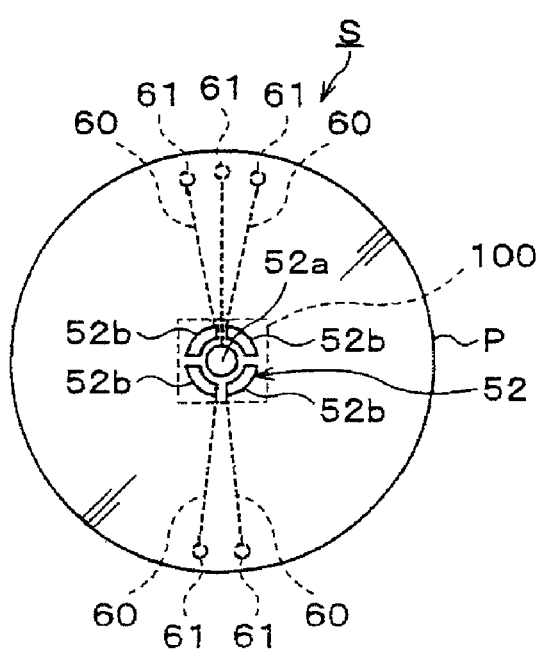

The detection electrode 52 is installed at, for example, a central portion on the rear surface of the position detecting wafer S, as illustrated in FIG. 4B. That is, the detection electrode 52 is disposed at a position corresponding to the central hole 42 when the position detecting wafer S is mounted on the mounting table 41 of the processing apparatus 10. The detection electrode 52 includes, for example, a central electrode portion 52a having a circular shape and four arc-shaped peripheral electrode portions 52b surrounding the central electrode portion 52a in a concentric circular shape. The electrostatic capacitance with respect to the facing reference object can be detected by these electrode portions 52a and 52b.

Figure 5:
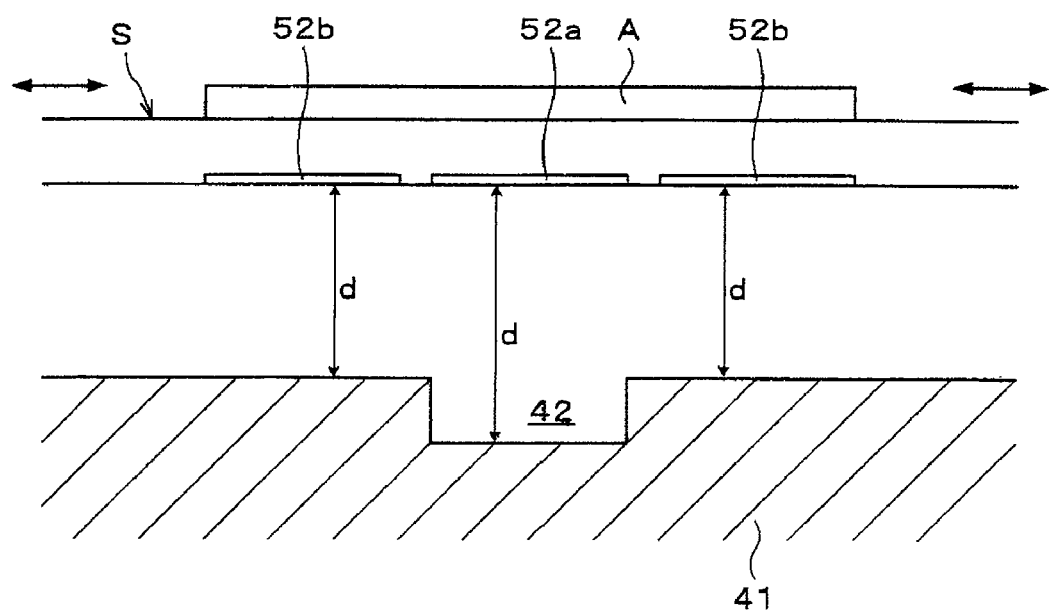
FIG. 5 is an explanatory diagram for illustrating distances between detection electrodes of the position detecting wafer and a front surface of a mounting table.

For example, as illustrated in FIG. 5, if relative positional relationships between the central electrode portion 52a and the peripheral electrode portions 52b of the detection electrode 52 and the reference object, e.g., the central hole 42 of the mounting table 41 are changed, a distance d between two poles, i.e., between each of the electrode portions 52a and 52b and the top surface of the mounting table 41 having the central hole 42 becomes changed, so that an electrostatic capacitance therebetween is varied (electrostatic capacitance $C = \in \cdot B/d$ ($\in$ refers to a dielectric constant between two poles ($\in = \in o \times \in s$, $\in o$ is a dielectric constant of a vacuum, $\in s$ is a relative dielectric constant), and B refers to an area of the electrode portion)).

Based on this scientific knowledge, the electrostatic capacitance values detected by the central electrode portion 52a and the peripheral electrode portions 52b have been previously investigated in relation with the corresponding relative positional relationship between the position detecting wafer S and the central hole 42 of the mounting table 41. Then, it is possible to detect the position of the position detecting wafer S on the mounting table 41, when viewed from the top, based on the detection result of the electrostatic capacitance by the detection electrode 52. Accordingly, the transfer point of the transfer arm 20 can be detected when the wafer W is transferred onto the mounting table 41.

Furthermore, in the present embodiment, the central electrode portion 52a and the central hole 42 are formed to have the same diameter. Therefore, if the position detecting wafer S is transferred onto the mounting table 41 properly, the central electrode portion 52a and the central hole 42 are completely overlapped with each other, so that it is easy to determine whether the position detecting wafer S has been transferred properly or not. Further, the central electrode portion 52a and the central hole 42 are not limited to have the same diameter but may be formed to have different diameters.

Figure 6:
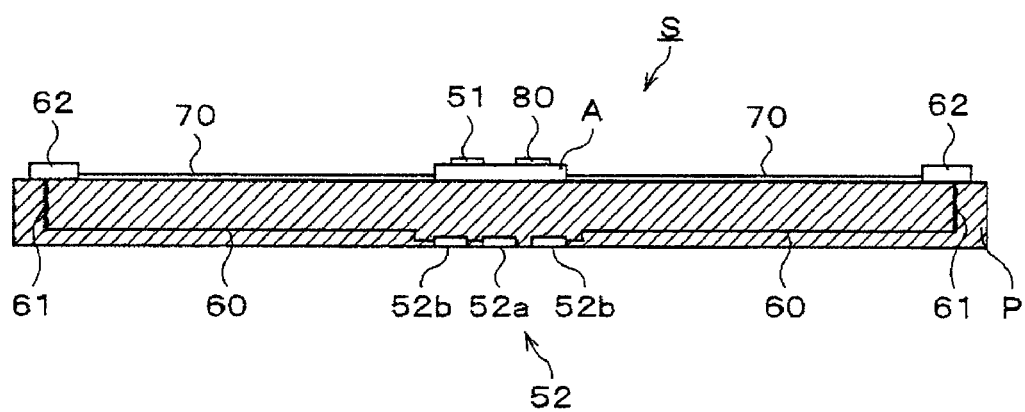
FIG. 6 offers an explanatory diagram showing a wiring structure of the position detecting wafer.

As illustrated in FIG. 4B, rear surface wirings 60 connected with each of the electrode portions 52a and 52b are formed on the rear surface of the position detecting wafer S. For example, the rear surface wirings 60 are extended from the detection electrode 52 formed in the center portion of the position detecting wafer S in diametric directions, and are connected with connection wirings 61 provided at the peripheral portion of the position detecting wafer S. The rear surface wirings 60 are formed such that they pass through, for example, the inside of the position detecting wafer S, as shown in FIG. 6.

The connection wirings 61 are formed from the rear surface side to the front surface side of the position detecting wafer S in a thickness direction. The connection wirings 61 are connected with amplifying circuits 62 provided on the front surface of the position detecting wafer S. That is, the amplifying circuits 62 are formed directly above the connection wirings 61 at the peripheral portion of the position detecting wafer S. The amplifying circuits 62 can amplify an output signal of the electrostatic capacitance detected by each of the electrode portions 52a and 52b.

The control circuit 51 is formed on a circuit board A installed on the center portion of the position detecting wafer S. The control circuit 51 is connected with the respective amplifying circuits 62 via a plurality of front surface wirings 70. The control circuit 51 is capable of controlling a detection of the electrostatic capacitance between the detection electrode 52 and the reference object by transceiving a signal of voltage or the like to/from the detection electrode 52. On the circuit board A, a wireless circuit 80 allowing the control circuit 51 to communicate with the external controller 30 wirelessly is installed. In addition, a power supply for the detection electrode 52, the control circuit 51, and the wireless circuit 80 and the like is installed at, e.g., the circuit board A.

Figure 7:
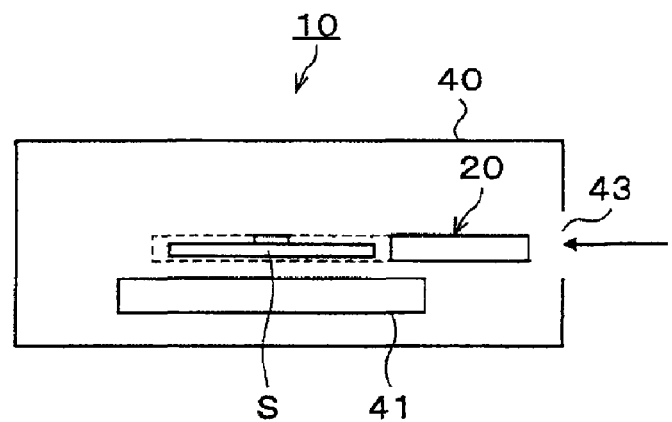
FIG. 7 is an explanatory diagram showing a state in which a transfer arm is loaded into the processing apparatus.

When adjusting the transfer point of the transfer arm 20 by using the position detecting wafer S having the above-mentioned configuration, the position detecting wafer S is first held on the transfer arm 20. Next, in accordance with current transfer point set by the controller 30, the transfer arm 20 is advanced into the processing chamber 40 from the transfer port 43 of the processing apparatus 10 and is stopped at a transfer position, i.e., a location above the center portion of the mounting table 41 as illustrated in FIG. 7. Thereafter, for example, the transfer arm 20 is descended, so that the position detecting wafer S is mounted on the mounting table 41. After that, according to instructions from the controller 30, for example, the electrostatic capacitance sensor 50 of the position detecting wafer S is operated, so that an electrostatic capacitance between each of the electrode portions 52a and 52b of the detection electrode 52 and the top surface of the mounting table 41 having the central hole 42 is detected.

Figure 8:
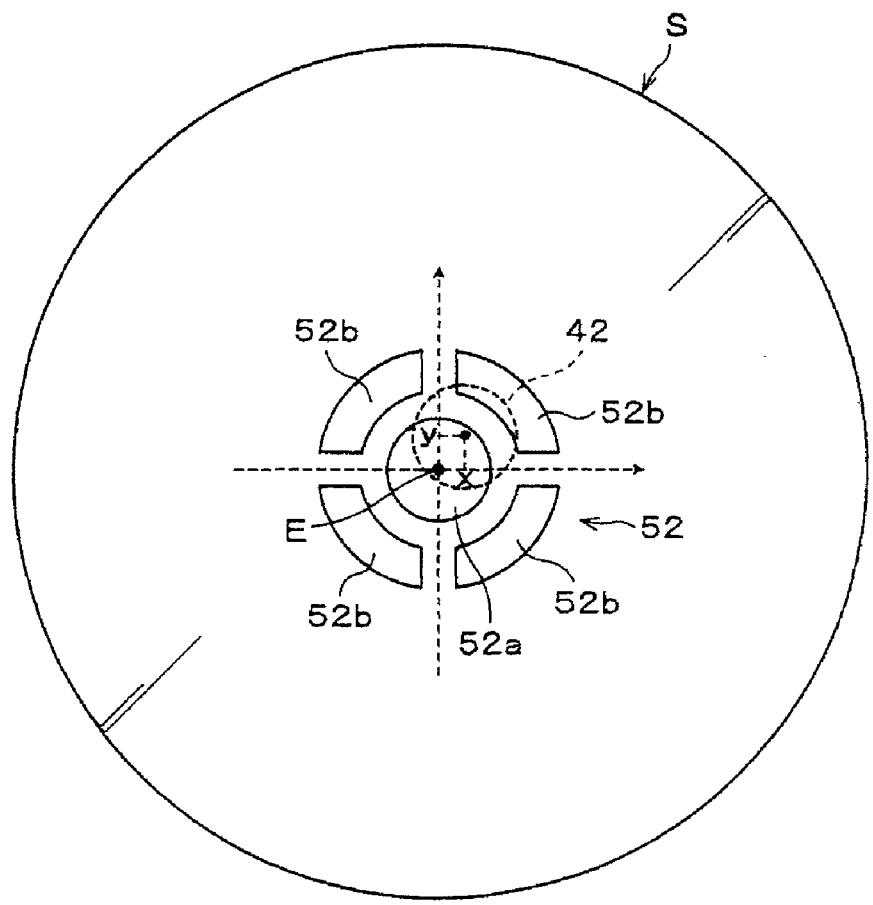
FIG. 8 shows an explanatory diagram for describing a position of a center hole with respect to a center point of the position detecting wafer.

At this time, the signal of the electrostatic capacitance detected by the detection electrode 52 is sent to the amplifying circuit 62 via the rear surface wiring 60 and the connection wiring 61 and then is transmitted to the control circuit 51 after being amplified by the amplifying circuit 62. The control circuit 51 receives the electrostatic capacitance signal from each detection electrode 52, and these electrostatic capacitance signals are transmitted wirelessly to the controller 30 by the wireless circuit 80. As illustrated in FIG. 8, for example, the controller 30 calculates the coordinates (x, y) of the central hole 42 with respect to a center point E of the position detecting wafer S based on the preset relationship between the electrostatic capacitance value of each of the electrode portions 52a and 52b and the position of the central hole 42 with respect to the position detecting wafer S. As described above, when the position of the center point E of the position detecting wafer S is deviated from that of the central hole 42, the electrostatic capacitance values of the central electrode portion 52a and the peripheral electrode portions 52b increase or decrease, so that the coordinates of the central hole 42 can be detected from these electrostatic capacitance values.

From the detected coordinates of the central hole 42, a deviation amount (x, y) between the center point E of the position detecting wafer S and the central hole 42 is obtained, and based on the obtained deviation amount, the transfer point of the transfer arm 20 is adjusted.

Meanwhile, a plurality of guard electrodes for blocking an electric field is provided on the position detecting wafer S in accordance with the present embodiment. Hereinafter, the configuration of the guard electrodes will be explained.

Figure 9:
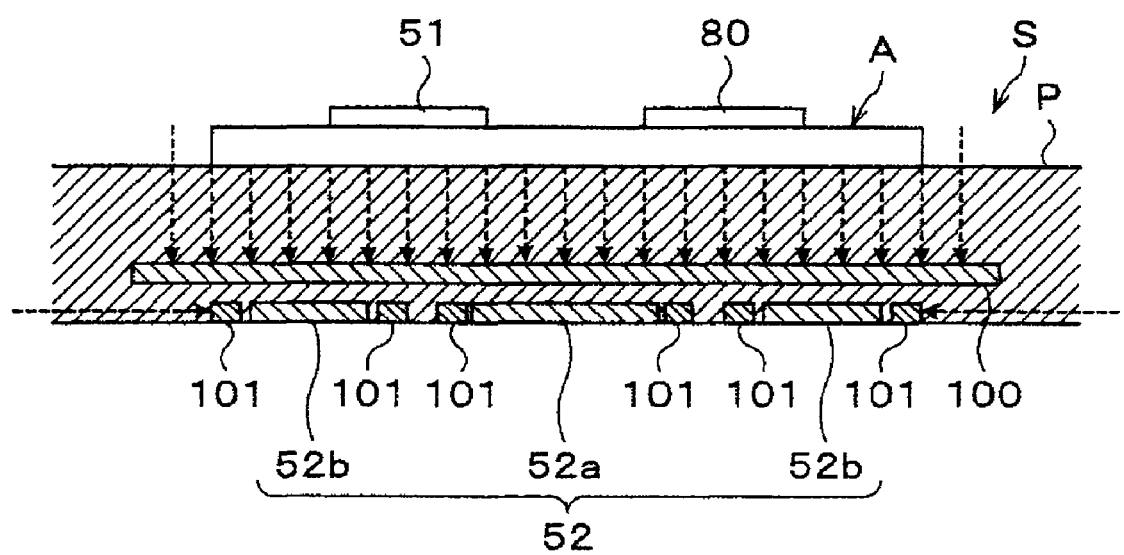
FIG. 9 is an explanatory diagram showing a detection electrode covered by guard electrodes.

For example, as shown in FIG. 9, the main body P of the position detecting wafer S is provided with a detection electrode guard electrode 100 covering the front surface of the detection electrode 52. The detection electrode guard electrode 100 has a rectangular flat shape and is formed to cover the entire top surface of the detection electrode 52 when viewed from the top, as illustrated in FIG. 4B, for example.

Further, as shown in FIG. 9, lateral guard electrodes 101 are installed at lateral portions of each of the central electrode portion 52a and the peripheral electrode portions 52b. The lateral guard electrode 101 is installed for each of the electrode portions 52a and 52b individually and is formed to surround each of the electrode portions 52a and 52b along the periphery thereof.

Figure 10:
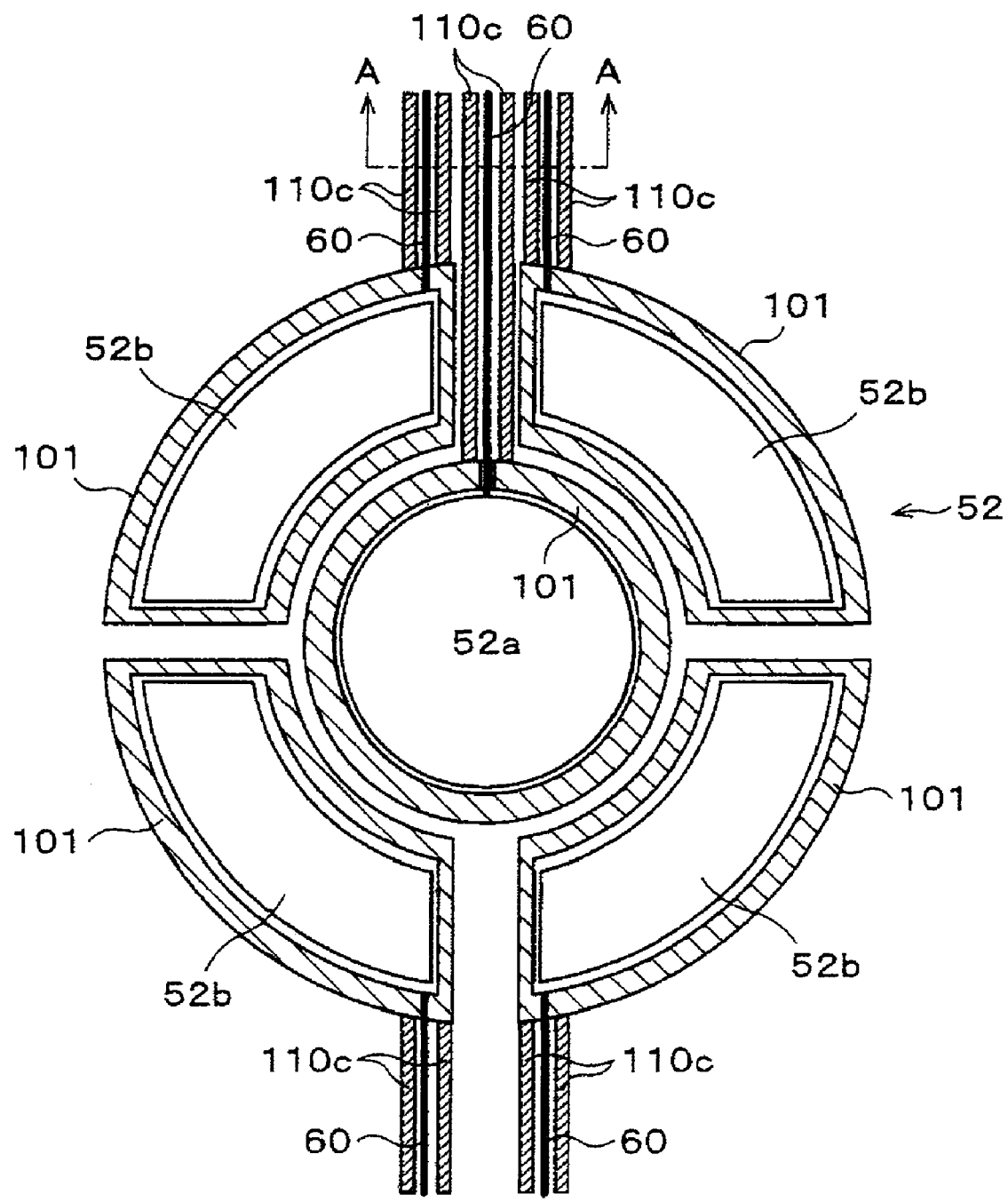
FIG. 10 is an explanatory diagram showing each electrode portion of the detection electrode surrounded by a lateral guard electrode.
Figure 11:
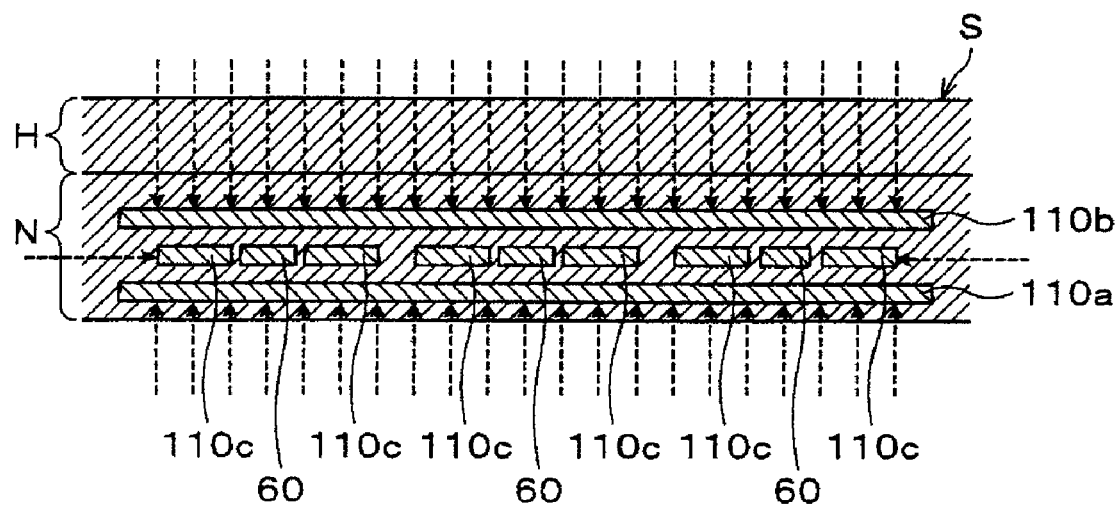
FIG. 11 is an explanatory diagram showing a cross section of the position detecting wafer taken along line A-A of FIG. 10.
Figure 12:
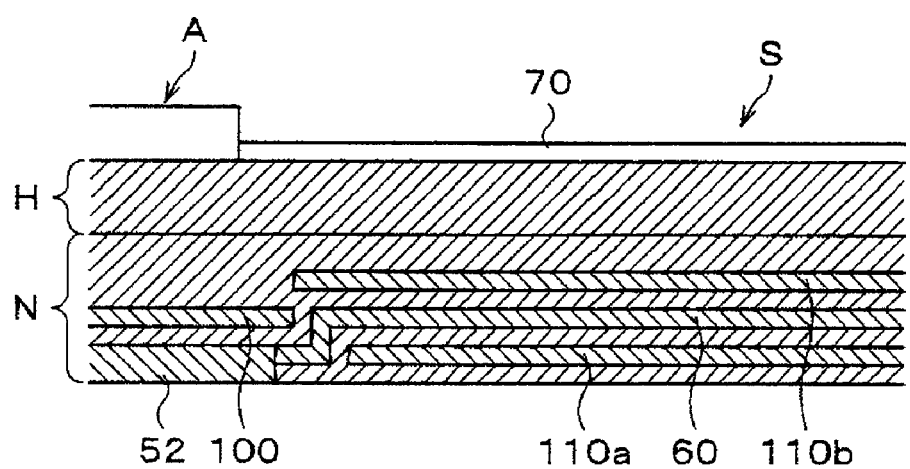
FIG. 12 offers an explanatory diagram showing a longitudinal cross section of the position detecting jig along a diametric direction.

Further, the rear surface wiring 60 is also surrounded by a rear surface wiring guard electrode. For example, as illustrated in FIGS. 11 and 12, a first rear surface wiring guard electrode 110a is installed on the rear surface side of the rear surface wirings 60, while a second rear surface wiring guard electrode 110b is installed on the top surface side of the rear surface wirings 60. Further, third rear surface wiring guard electrodes 110c are installed at each of left and right lateral portions of the rear surface wirings 60, as illustrated in FIGS. 10 and 11.

For example, the third rear surface wiring guard electrodes 110c are installed at left and right sides of each of the plurality of rear surface wirings 60. The first and second rear surface wiring guard electrodes 110a and 110b are formed in flat plate shapes so that they cover the plurality of neighboring rear surface wirings 60 altogether, as shown in FIG. 11. Further, the rear surface wiring guard electrodes 110a, 110b and 110c are connected with each other by a non-illustrated connection line.

Figure 13:
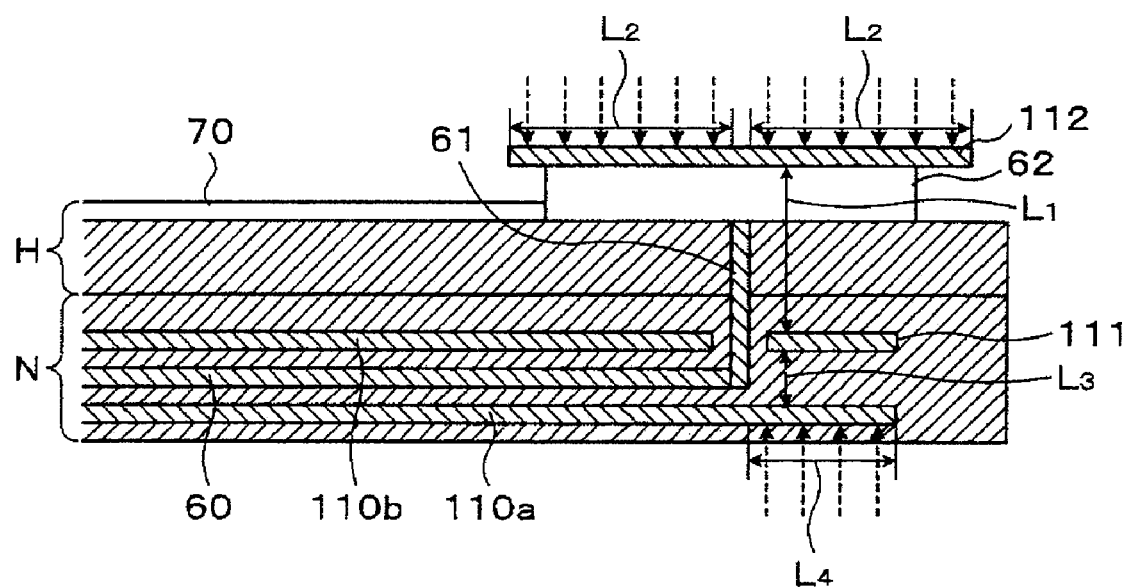
FIG. 13 is an explanatory diagram showing a cross section of a peripheral portion of the position detecting jig.

The rear surface wiring guard electrodes 110a, 110b and 110c are formed up to the vicinity of the connection wiring 61. The second rear surface wiring guard electrode 110b is extended up to, e.g., a position just in front of the connection wiring 61, as illustrated in FIG. 13. At the opposite side of the second rear surface wiring guard electrode 110b with respect to the interposed connection wiring 61, an external guard electrode 111 is formed at the same height as the second rear surface wiring guard electrode 110b. With this configuration, the lateral portion of the connection wiring 61 is surrounded by the second rear surface wiring guard electrode 110b and the external guard electrode 111. The first rear surface wiring guard electrode 110a is extended up to a position outside the connection wiring 61 by passing by the bottom surface of the connection wiring 61, to thereby cover the bottom surface of the connection wiring 61. In the present embodiment, the first rear surface wiring guard electrode 110a also serves as a connection wiring guard electrode on the rear surface of the connection wiring 61.

On the front surface of the amplifying circuit 62, there is formed a flat plate-shaped surface guard electrode 112 for the connection wiring. The surface guard electrode 112 covers the top surface of the connection wiring 61 with the amplifying circuit 62 interposed therebetween.

As described above, the bottom surface of the connection wiring 61 is covered by the first rear surface wiring guard electrode 110a, while the top surface of the connection wiring 61 is covered by the surface guard electrode 112. Furthermore, the left and right sides of the connection wiring 61 are surrounded by the second rear surface wiring guard electrode 110b and the external guard electrode 111. However, the second rear surface wiring guard electrode 110b and the external guard electrode 111 only cover a part of the left and right sides of the connection wiring 61, so that the connection wiring 61 has a portion where its left and right sides are unguarded by the guard electrodes. Accordingly, as shown in FIG. 13, the surface guard electrode 112 is formed to cover the top surface of the connection wiring 61 in a manner that each of the inner side length and the outer side length of the surface guard electrode 112 from the connection wiring 61 is equivalent to a length $L_2$, which is at least three times as long as a length $L_1$ of an unguarded portion from the bottom surface of the surface guard electrode 112 to the second rear surface wiring guard electrode 110b (external guard electrode 111). Further, the center of the surface guard electrode 112 in a horizontal direction is aligned with the position of the connection wiring 61. With this configuration, it is possible to prevent an electric field from reaching the unguarded left and right portions of the connection wiring 61 from the upper part.

Likewise, the first rear surface wiring guard electrode 110a is formed to cover the bottom surface of the connection wiring 61 in a manner that the outer side length of the first rear surface wiring guard electrode 110a from the connection wiring 61 is equivalent to a length $L_4$, which is at least three times as long as a length $L_3$ of an unguarded portion from the top surface of the first rear surface wiring guard electrode 110a to the second rear surface wiring guard electrode 110b (external guard electrode 111). With this configuration, it is possible to prevent an electric field from reaching the unguarded left and right portions of the connection wiring 61 from below.

Each of the guard electrodes 100, 101, 110a to 110c, 111 and 112 is connected to a non-illustrated power supply installed on, e.g., the circuit board A or the like, and a voltage can be controlled such that each guard electrode has the same electric potential as that of, e.g., the guarded detection electrode 52 or wirings 60 and 61. By setting them to have the same voltage, the electric field from the outside can be blocked.

Further, in the above-described embodiment, the front surface of the main body P of the position detecting wafer S is formed of a ceramic or silicon substrate H, as shown in FIG. 11, while a layer N of the rear surface of the main body P of the position detecting wafer S, e.g., the detection electrode 52, the wirings 60 and 61, and the guard electrodes 100, 101, 110a to 110c and 111 are formed by a photolithography process in which a film formation, an exposure, a development and an etching are repeated. Furthermore, a protection film made of an insulating material is formed on a surface layer of the rear surface of the position detecting wafer S to prevent a damage of the detection electrode 52 due to a repeated use, for example.

When detecting the electrostatic capacitance between the detection electrode 52 and the central hole 42 of the mounting table 41 by using the electrostatic capacitance sensor 50 of the position detecting wafer S, an electric field oriented toward the detection electrode 52 from the above part or side parts thereof is blocked by the guard electrodes 100 and 101, as illustrated in FIG. 9, so that the detection of the electrostatic capacitance by the detection electrode 52 can be carried out properly. Moreover, as shown in FIG. 11, an electric field oriented toward the rear surface wirings 60 is also blocked by the guard electrodes 110a to 110c, so that the electric signal of the electrostatic capacitance can flow through the rear surface wirings 60 without being affected by the external electric field. In addition, as illustrated in FIG. 13, an electric field oriented toward the connection wiring 61 is also blocked by the guard electrodes 110a, 110b, 111 and 112, so that the electric signal of the electrostatic capacitance is allowed to flow through the connection wiring 61 without being affected by the external electric field. Further, the electric signal sent to the amplifying circuit 62 is amplified, and then transmitted to the control circuit 51.

In accordance with the embodiment described above, since the top surface of the detection electrode 52 of the position detecting wafer S is covered by the detection electrode guard electrode 100, the electric field oriented toward the detection electrode 52 from the front surface side of the position detecting wafer S is blocked, so that the detection electrode 52 is prevented from being affected by the external electric field from the front surface side thereof. Therefore, the detection of the electrostatic capacitance by the detection electrode 52 can be performed more accurately and stably. As such, since the detection accuracy of the electrostatic capacitance is improved, even a slight amount of deviation can be detected, so that the accuracy of the position detection by the position detecting wafer S can be ameliorated.

Since the control circuit 51 is installed on the front surface of the position detecting wafer S to be located opposite to the detection electrode 52 with respect to the detection electrode guard electrode 100 interposed therebetween, an electric field generated from the control circuit 51 can be prevented from reaching the detection electrode 52.

The front surface and the rear surface of the rear surface wiring 60 are covered with the first and second rear surface wiring guard electrodes 110a and 110b, so that the electric field oriented toward the rear surface wiring 60 from the outside can be blocked. Accordingly, since the electric signal flowing through the rear surface wirings 60 is prevented from being affected by the external electric field, an accurate electric signal can be transmitted from the detection electrode 52 to the control circuit 51, so that the position detection by the position detecting wafer S can be carried out accurately. Furthermore, because the third rear surface wiring guard electrodes 110c are installed at the left and right sides of each of the plurality of rear surface wirings 60, malfunctioning between the rear surface wirings 60 can be prevented.

Furthermore, since the front surface and the rear surface of the connection wiring 61 are covered by the guard electrodes 112 and 110a, the electric field oriented toward the connection wiring 61 from the front surface side and the rear surface side can be blocked. Especially, the horizontal lengths $L_2$ and $L_4$ of the guard electrodes 112 and 110a are set to be at least three times as long as the lengths $L_1$ and $L_3$ of the connection wiring 61's unguarded portions with respect to the electric field, ranging from the guard electrodes 112 and 110a to the portion where the guard electrodes is disposed at the lateral side of the connection wiring 61. Accordingly, the electric field that would be introduced into the unguarded lateral portion of the connection wiring 61 from the upper or lower part can be blocked. Therefore, a more accurate electric signal of the electrostatic capacitance can be sent to the control circuit 51 from the detection electrode 52, thus enabling more precise position detection by the position detecting wafer S.

Since the amplifying circuit 62 is installed on the front surface of the connection wiring 61 and the surface guard electrode 112 is installed on the front surface of the amplifying circuit 62, an electric field oriented toward the amplifying circuit 62 from the upper part can also be blocked. Therefore, a weak signal detected by the detection electrode 52 can be sent to the amplifying circuit 62 accurately. Furthermore, since the signal has been amplified, no problem would occur when it flows from the amplifying circuit 62 to the control circuit 51 even if the signal is exposed to the external electric field.

Since the wireless circuit 80 is installed on the front surface of the position detecting wafer S, the electrostatic capacitance detection result by the electrostatic capacitance sensor 50 can be transmitted to the controller 30 wirelessly. Further, operation instructions can also be sent to the position detecting wafer S from the controller 30 wirelessly. Therefore, even with the transfer arm 20 for transferring the wafer W into a narrow space, a position adjustment can be performed without having to consider the wiring or the like.

Since the detection electrode 52 is surrounded by the lateral guard electrodes 101, an electric field oriented from the side part can also be blocked, so that the detection of the electrostatic capacitance by the detection electrode 52 can also be performed more accurately. Therefore, the accuracy of the position detection by the position detecting wafer S can be further improved.

Since the detection electrode 52 is made up of the plurality of electrode portions 52a and 52b and the respective electrode portions 52a and 52b are surrounded by the individual lateral guard electrodes 101, the electric field toward each of the electrode portions 52a and 52b from the side part can be blocked further securely.

In the embodiment as described above, the detection electrode 52 has the central electrode portion 52a of the circular shape and the plurality of peripheral electrode portions 52b of the arc shape disposed concentrically with the central electrode portion. Therefore, an X-Y directional deviation of the reference object can be detected accurately, thus allowing the position detection by the position detecting wafer S to be carried out accurately.

Figure 14:
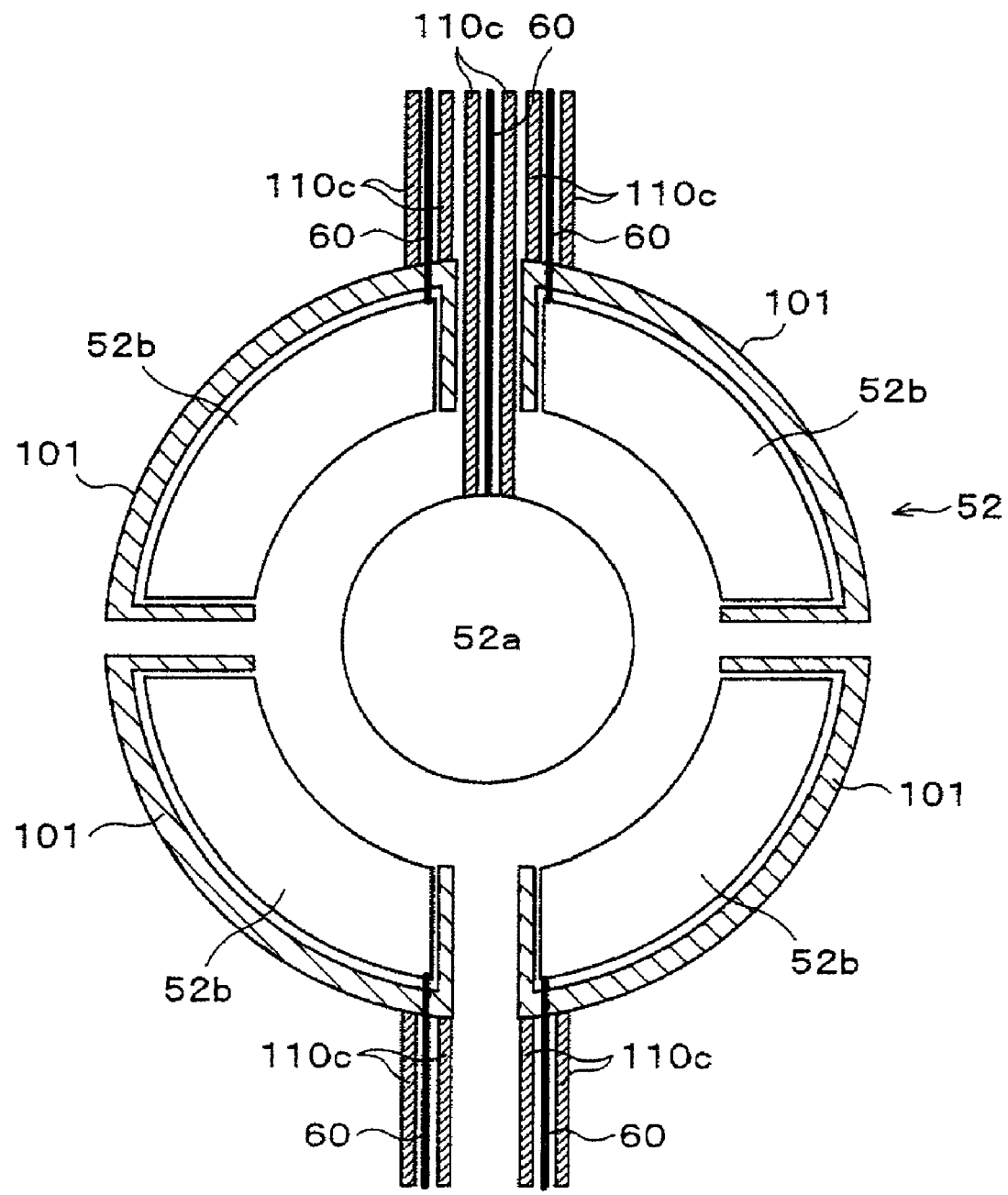
FIG. 14 is an explanatory diagram showing another arrangement example of the guard electrodes of each electrode portion of the detection electrode.

In the embodiment as described above, though the lateral guard electrode 101 is installed for each of the electrode portions 52a and 52b, the guard electrode surrounding the central electrode portion 52a may be omitted as illustrated in FIG. 14 because the periphery of the central electrode portion 52a is surrounded by the peripheral electrode portions 52b. Further, the guard electrode on the inner side of the peripheral electrode portions 52b can also be omitted. In this way, the arrangement of the guard electrodes can be simplified.

The above description of the present invention is provided for the purpose of illustration, and it would be understood by those skilled in the art that various changes and modifications may be made without changing technical conception and essential features of the present invention. Thus, it is clear that the above-described embodiments are illustrative in all aspects and do not limit the present invention.

For example, the number, the size, the shape or the position of the detecting electrode 52 on the rear surface of the position detecting wafer S can be appropriately selected depending on the reference object for the position alignment. Further, the position or the number of the amplifying circuit 62 or the control circuit 51 on the front surface of the position detecting wafer S shall not be limited to the above-described examples. Furthermore, the position or the number of the rear surface wirings 60 and the connection wirings 61 in the position detecting wafer S shall not be limited to the above-described examples, either. Also, the reference object is not limited to the central hole 42, and it may be any object as long as it has an irregularity. In the above-described embodiment, though the position detected by the position detecting wafer S is a position on the horizontal plane, the position detecting wafer S may detect a position in a vertical direction as well. In addition, it may be possible to install any other circuits, such as a circuit of an acceleration sensor or the like, having other functions to adjust the position on the front surface of the position detecting wafer S. Furthermore, in the above-described embodiment, though the position detecting jig is of the wafer type, it may be of a substrate type having another shape, e.g., a rectangular shape.

Experiment Example 1

Hereinafter, there was conducted an evaluation of the effect of setting the length of the connection wiring guard electrode from the connection wiring to be at least three times as long as the length of the connection wiring's unguarded portion from the electric field in the position detecting jig in accordance with the present disclosure.

Figure 15:
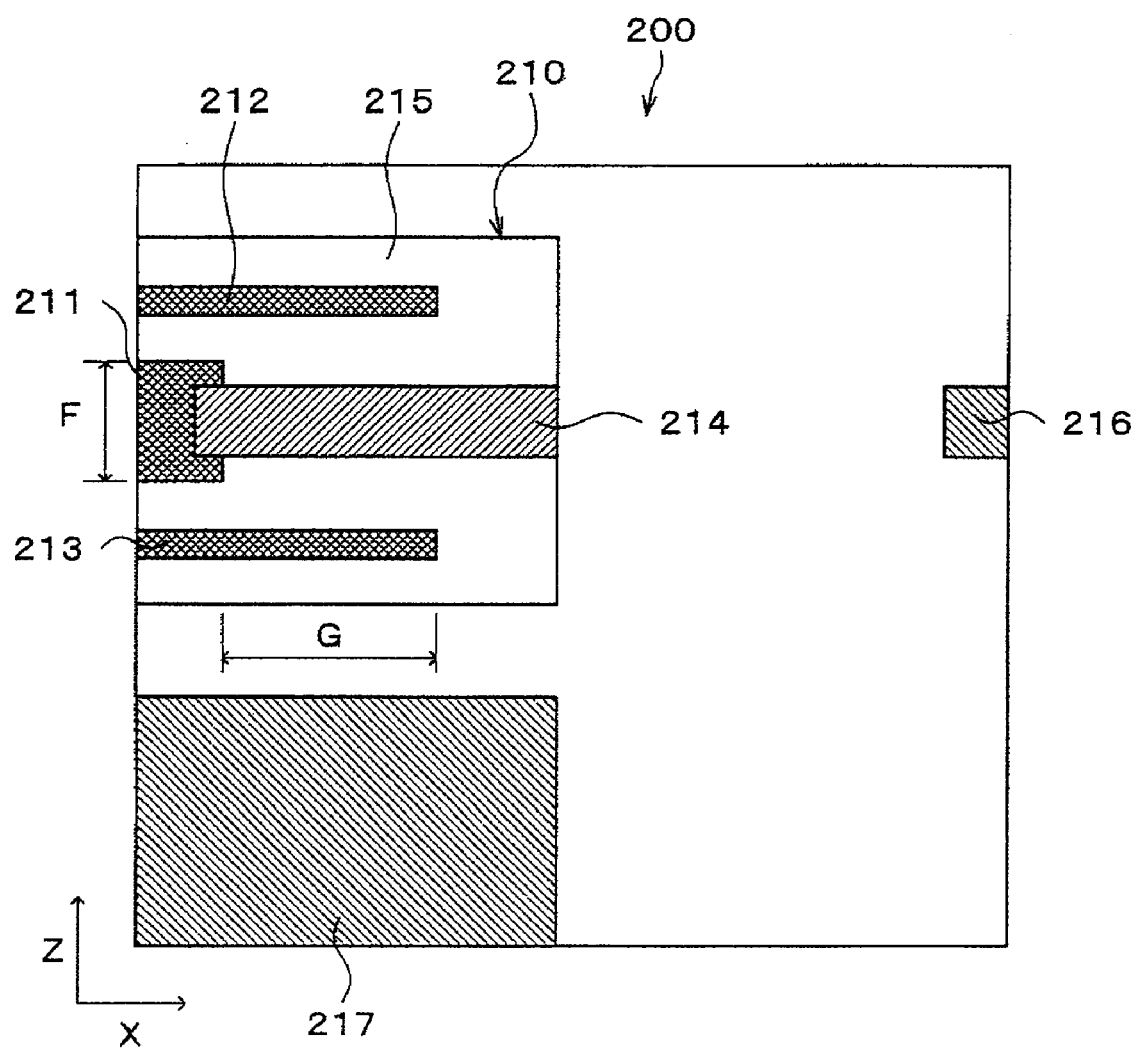
FIG. 15 depicts a cross sectional view showing a schematic configuration of a structure used in an experiment example.

In the present experiment example, a structure 200, as shown in FIG. 15, having a jig 210 serving as the position detecting wafer S in accordance with the present embodiment was used. FIG. 15 provides a cross sectional view of the structure 200. The jig 210 includes a conductor 211 as the connection wiring 61, a conductor 212 as the guard electrode 112, a conductor 213 as the guard electrode 110a, a dielectric 214 as the substrate H, and a dielectric 215 as the layer N. The conductors 211 to 213 and the dielectrics 214 and 215 have the substantially identical configuration as that of the position detecting wafer S shown in FIG. 13 in accordance with the present embodiment. Further, conductors 216 and 217 are also provided on the structure 200 to generate an electric field within the structure 200, as illustrated in FIG. 15. The conductors 216 and 217 are installed at the side part (positive direction of X direction) and the lower part (negative direction of Z direction) of the conductor 211, respectively.

The Z-directional length (thickness) F of the conductor 211 is about 0.802 mm. The thickness of each of the conductors 211 and 213 is about 1 μm, and the thickness of the dielectric 214 is about 0.8 μm. Further, the dielectric constant of the dielectric 214 is about 8.5, and the dielectric constant of the dielectric 215 is about 2.9.

Further, in the present experiment example, the external guard electrode 111 of the connection wiring 61 in accordance with the present embodiment is not provided. Accordingly, the Z-directional length F of the conductor 211 represents the lengths $L_1$ and $L_3$ of the connection wirings 61's unguarded portions with respect to the electric field.

By using the structure 200 having such configuration, a field intensity vector in the vicinity of the conductor 211 was measured while varying the length G of the conductors 212 and 213 from the conductor 211 in the positive direction of the X direction, i.e., from 0 mm to 0.8 mm, 1.6 mm, 2.4 mm and 3.2 mm.

Figure 16A:
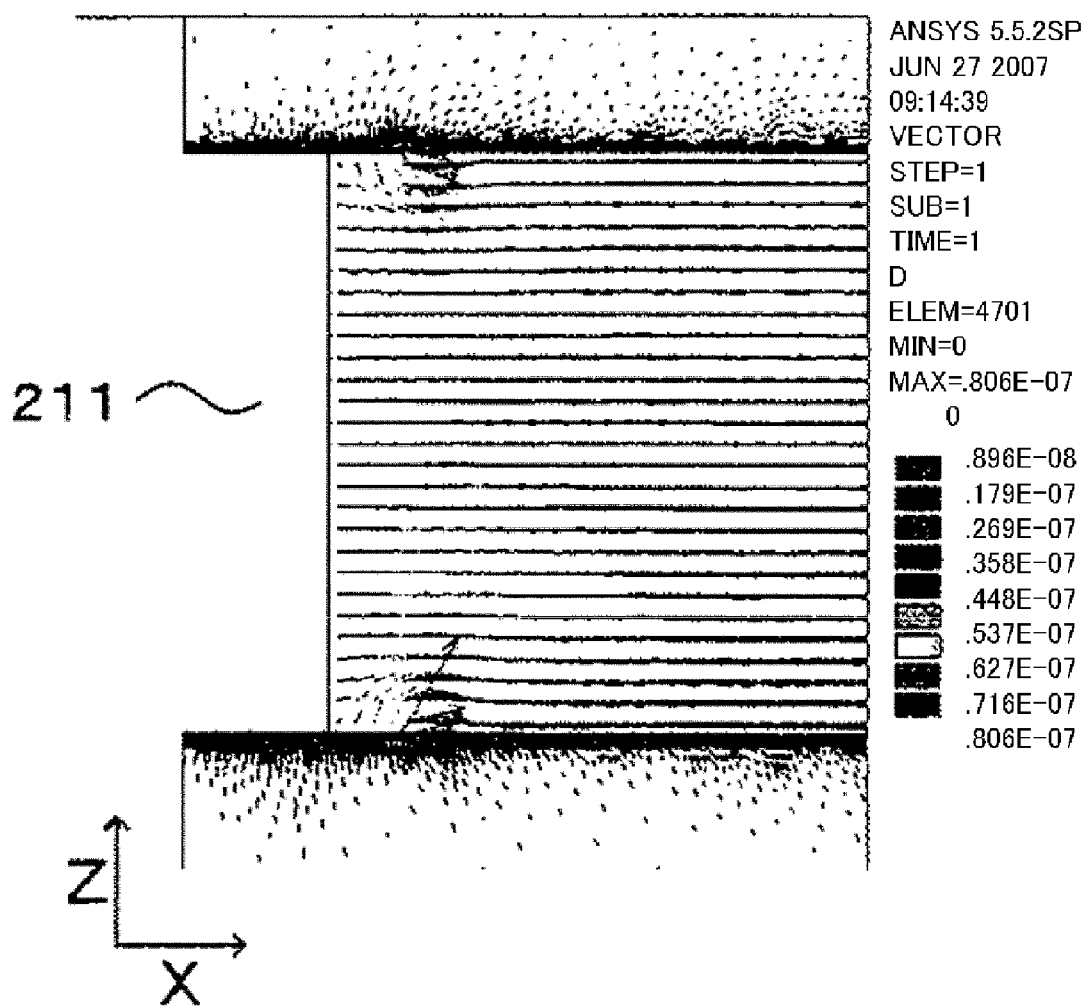
FIGS. 16A to 16E provide graphs showing a measurement result of a field intensity vector in the vicinity of a conductor in the experiment example.
Figure 16B:
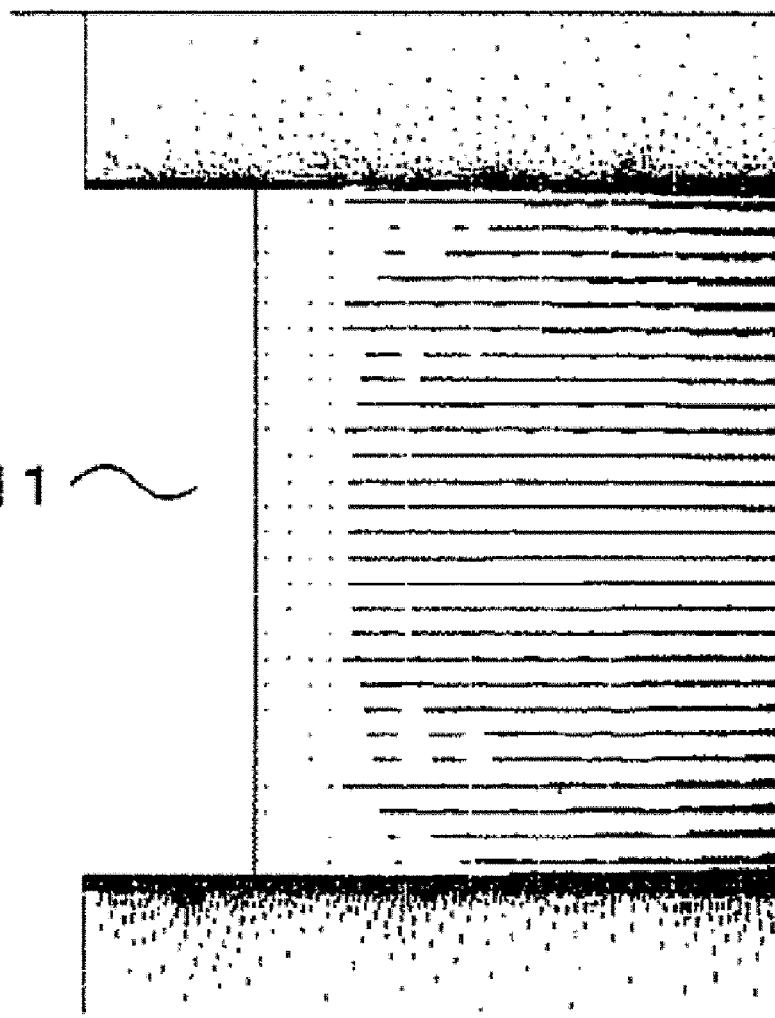
Figure 16C:
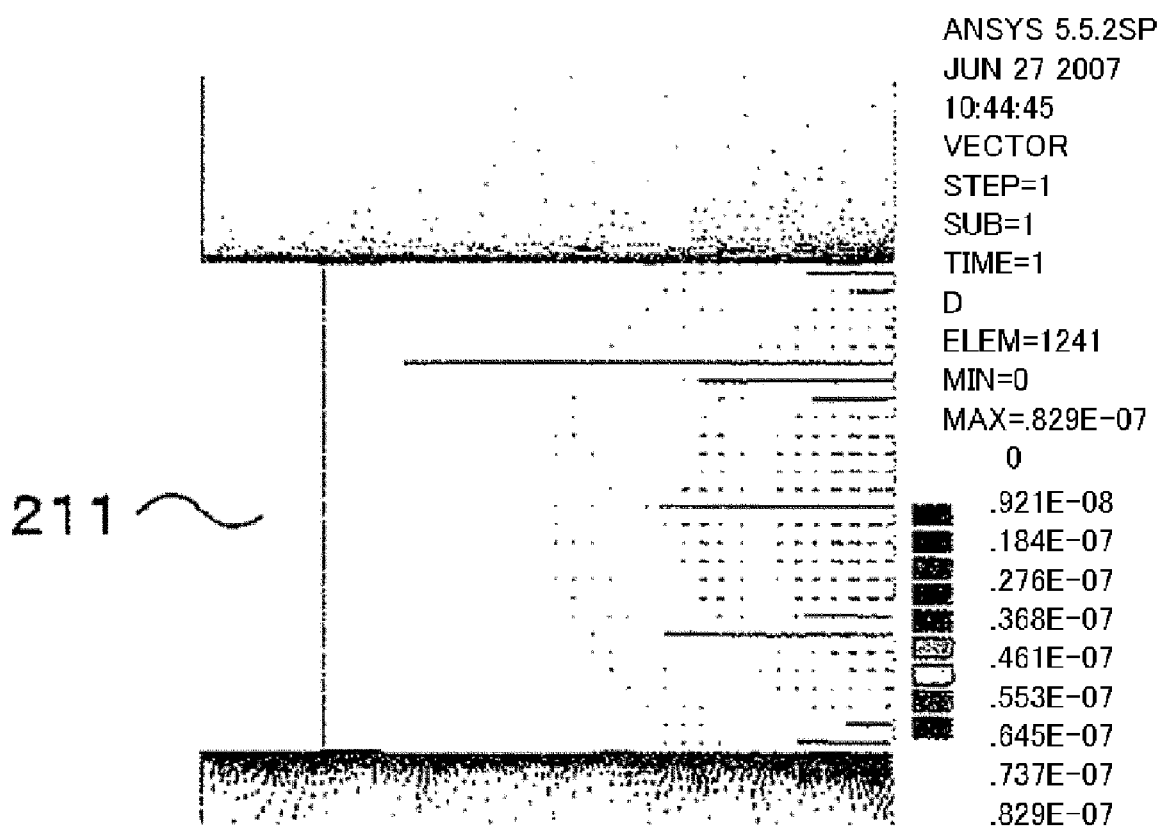

The result of measuring the field intensity vector in the vicinity of the conductor 211 is provided in FIGS. 16A to 16E. When the length G of the conductors 212 and 213 was 0 mm, a field intensity vector having a relatively strong intensity was measured from the conductor 211 toward the conductor 216 (in the positive direction of the X direction), as shown in FIG. 16A, and there was observed no guard effect by the conductors 212 and 213 against the electric field. When the length G of the conductors 212 and 213 was 0.8 mm, though the intensity of the field intensity vector was weakened in comparison with the case where the length G was 0 mm, a field intensity vector was still measured from the conductor 211 toward the conductor 216 (in the positive direction of the X direction), as shown in FIG. 16B, and the guard effect by the conductors 212 and 213 against the electric field was insufficient. Likewise, when the length G of the conductors 212 and 213 was 1.6 mm, though the intensity of the field intensity vector was further weakened in comparison with the case where the length G was 0.8 mm, a field intensity vector was still measured from the conductor 211 toward the conductor 216 (in the positive direction of the X direction), as shown in FIG. 16C, and the guard effect by the conductors 212 and 213 was still insufficient.

Figure 16D:
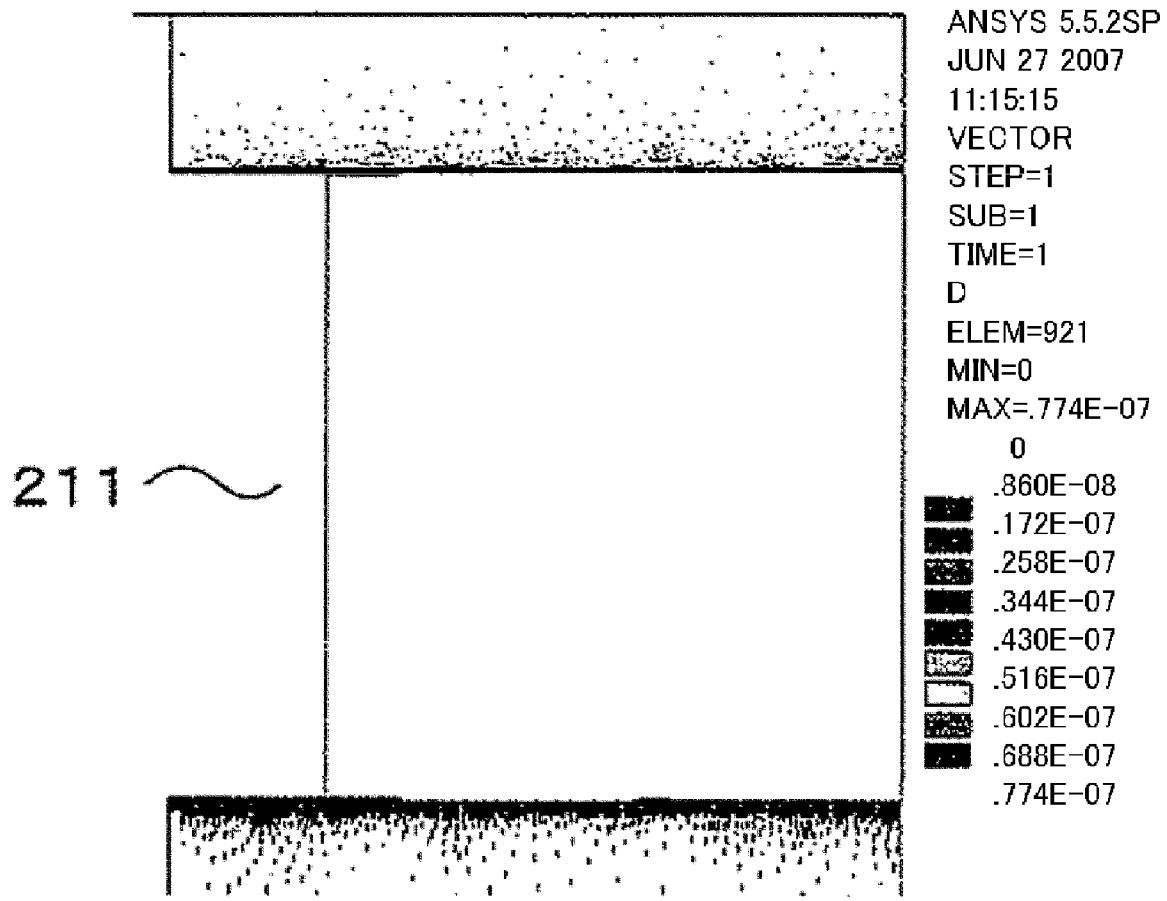
Figure 16E:
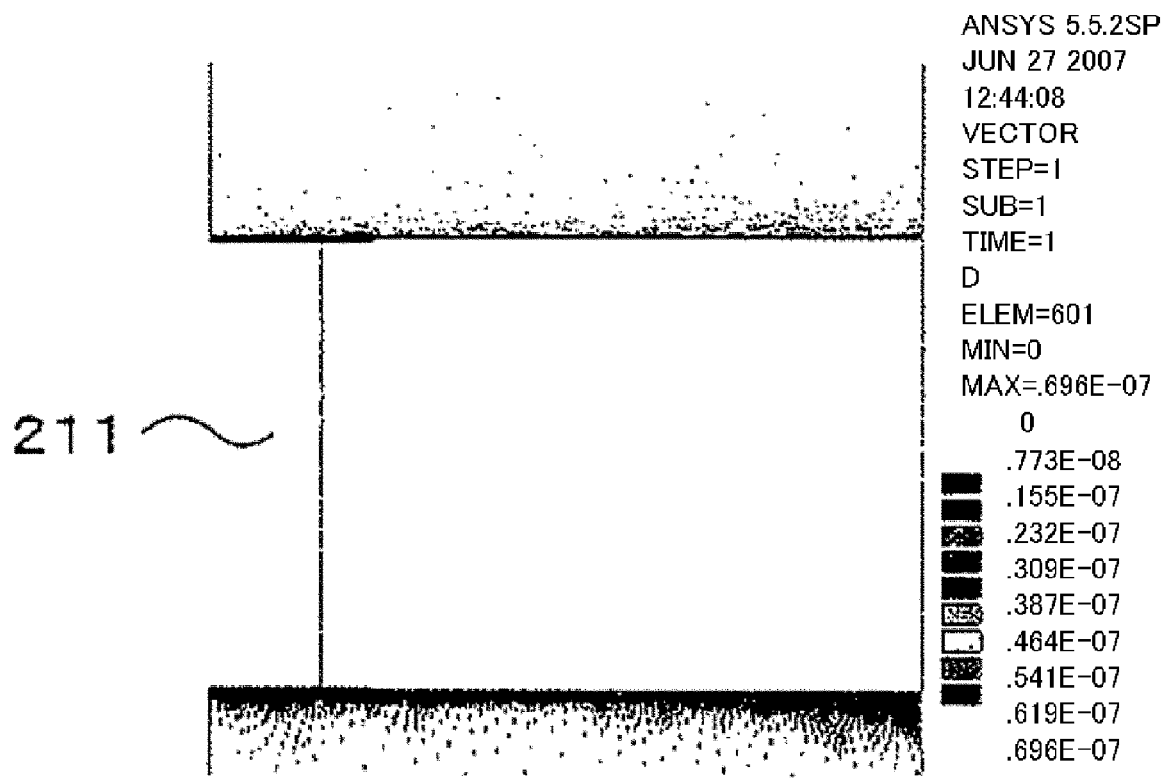

When the length G of the conductors 212 and 213 was 2.4 mm, no field intensity vector oriented from the conductor 211 toward the conductor 216 (in the positive direction of the X direction) was measured, as shown in FIG. 16D. That is, it was proved that the conductors 212 and 213 can block the electric field from reaching the vicinity of the conductor 211. Likewise, when the length G of the conductors 212 and 213 was 3.2 mm, no field intensity vector oriented from the conductor 211 toward the conductor 216 (in the positive direction of the X direction) was measured, as shown in FIG. 16E.

As described, it was confirmed that it is possible to block the electric field from reaching the conductor 211 from the conductors 212 and 213 by setting the length G of the conductors 212 and 213 to be at least three times as long as the length F of the conductor 211. That is, it could be confirmed that if the length of the connection wiring guard electrode from the connection wiring is at least three times as long as the length of the connection wiring's unguarded portion with respect to the electric field, it is possible to block the electric field from reaching the vicinity of the connection wiring.

The present invention has many advantages when it is used to properly perform the position alignment of the transfer arm by detecting the transfer point of the transfer arm more accurately and stably.

The scope of the present invention is defined by the following claims rather than by the detailed description of the embodiment. It shall be understood that all modifications and embodiments conceived from the meaning and scope of the claims and their equivalents are included in the scope of the present invention.

What is claimed is:

1. A position detecting jig for detecting a transfer point of a transfer arm which holds and transfers a substrate, the jig being formed in a substrate shape transferable by the transfer arm and the jig comprising:
   an electrostatic capacitance sensor for detecting a relative position with respect to a reference object by detecting an electrostatic capacitance in relation with the reference object for a position detection,
   wherein the electrostatic capacitance sensor includes a detection electrode for forming the electrostatic capacitance in relation with the reference object, the detection electrode is installed on a rear surface of a main body of the substrate shape, and
   installed on the main body is a guard electrode covering the detecting electrode when viewed from a front surface thereof, for blocking an electric field oriented toward the detection electrode from the front surface.

2. The position detecting jig of claim 1, wherein the electrostatic capacitance sensor includes a control circuit connected with the detection electrode, for controlling a detection of the electrostatic capacitance by the detection electrode, and
   the control circuit is installed on the front surface of the main body to be located opposite to the detection electrode with the guard electrode interposed therebetween.

3. The position detecting jig of claim 2, wherein a rear surface wiring for connecting the control circuit with the detection electrode is installed on the rear surface of the main body, and
   a front surface and a rear surface of the rear surface wiring are covered by a rear surface wiring guard electrode.

4. The position detecting jig of claim 3, wherein the rear surface wiring comprises a plurality of rear surface wirings, and
   both lateral sides of each rear surface wiring are covered by individual rear surface wiring guard electrodes.

5. The position detecting jig of claim 3, wherein a front surface wiring connected with the control circuit is formed on the front surface of the main body,
   the rear surface wiring and the front surface wiring are connected with each other by a connection wiring extended in a thickness direction from the rear surface of the main body toward the front surface thereof, and
   a front surface and a rear surface of the connection wiring are covered by a connection wiring guard electrode.

6. The position detecting jig of claim 5, wherein a length of the connection wiring guard electrode from the connection wiring in an in-surface direction of the main body is set to be at least three times as long as a length of an unguarded portion of the connection wiring against the electric field, ranging from the connection wiring guard electrode to a lateral guard electrode of the connection wiring.

7. The position detecting jig of claim 6, wherein an amplifying circuit for amplifying a signal of the electrostatic capacitance detected by the detection electrode is installed on the front surface of the connection wiring, and
the connection wiring guard electrode of the front surface thereof is formed on a surface of the amplifying circuit.

8. The position detecting jig of claim 2, wherein a wireless circuit communicating between an external controller for adjusting the transfer point of the transfer arm and the control circuit is installed on the front surface of the main body.

9. The position detecting jig of claim 1, wherein a lateral guard electrode is installed at a lateral portion of the detection electrode on the rear surface of the main body to surround the detection electrode.

10. The position detecting jig of claim 9, wherein the detection electrode includes a plurality of electrode portions, and
the respective electrode portions are surrounded by individual lateral guard electrodes.

11. The position detecting jig of claim 10, wherein the detection electrode includes a central electrode portion of a circular shape and a multiplicity of peripheral electrode portions of an arc shape, arranged to be concentric with the central electrode portion.

* * * * *